(12) United States Patent
Chung et al.

(10) Patent No.: US 8,018,151 B2
(45) Date of Patent: Sep. 13, 2011

(54) QUASI-OPTICAL LED PACKAGE STRUCTURE FOR INCREASING COLOR RENDER INDEX AND BRIGHTNESS

(75) Inventors: Chia-Tin Chung, Toufen Township, Miaoli County (TW); Fang-Kuei Wu, Yangmei Township, Taoyuan County (TW); Shen-Ta Yang, Taipei (TW)

(73) Assignee: Paragon Semiconductor Lighting Technology Co., Ltd., Taoyuan County (TW)

( * ) Notice: Subject to any disclaimer, the term of this patent is extended or adjusted under 35 U.S.C. 154(b) by 119 days.

(21) Appl. No.: 12/591,378

(22) Filed: Nov. 18, 2009

(65) Prior Publication Data

US 2011/0050071 A1 Mar. 3, 2011

(30) Foreign Application Priority Data

Aug. 26, 2009 (TW) .............................. 98128662 A

(51) Int. Cl.
*H01J 1/62* (2006.01)
(52) U.S. Cl. ...................... 313/506; 313/509; 313/512
(58) Field of Classification Search .................. 313/498, 313/505, 506, 509, 512
See application file for complete search history.

(56) References Cited

U.S. PATENT DOCUMENTS

| | | | | |
|---|---|---|---|---|
| 4,241,281 A | * | 12/1980 | Morimoto et al. | 315/161 |
| 4,713,579 A | * | 12/1987 | Miura | 313/500 |
| 6,345,903 B1 | * | 2/2002 | Koike et al. | 362/241 |
| 7,478,925 B2 | * | 1/2009 | Hiyama et al. | 362/249.02 |

\* cited by examiner

*Primary Examiner* — Vip Patel
(74) *Attorney, Agent, or Firm* — Rosenberg, Klein & Lee

(57) ABSTRACT

A quasioptical LED package structure for increasing color render index and brightness includes a substrate unit, a light-emitting unit, a frame unit and a package unit. The light-emitting unit has a first light-emitting module for generating a first color temperature and a second light-emitting module for generating a second color temperature. The frame unit has two annular resin frames surroundingly formed on the top surface of the substrate unit by coating. The two annular resin frames respectively surround the first light-emitting module and the second light-emitting module in order to form two resin position limiting spaces above the substrate unit. The package unit has a first translucent package resin body and a second translucent package resin body both disposed on the substrate unit and respective covering the first light-emitting module and the second light-emitting module.

20 Claims, 15 Drawing Sheets

QUASI-OPTICAL LED PACKAGE STRUCTURE FOR INCREASING COLOR RENDER INDEX AND BRIGHTNESS

BACKGROUND OF THE INVENTION

1. Field of the Invention

The present invention relates to a quasi-optical LED package structure, in particular, to a quasi-optical LED package structure for increasing color render index and brightness.

2. Description of Related Art

The invention of the lamp greatly changed the style of building construction and the living style of human beings, allowing people to work during the night. Without the invention of the lamp, we may stay in the living conditions of ancient civilizations.

Various lamps such as incandescent bulbs, fluorescent bulbs, power-saving bulbs and etc. have been intensively used for indoor illumination. These lamps commonly have the disadvantages of quick attenuation, high power consumption, high heat generation, short working life, high fragility, and being not recyclable. Further, the rapid flow of electrons (about 120 per second) through the electrodes of a regular fluorescent bulb causes an unstable current at the onset of lighting a fluorescent bulb, resulting in a flash of light that is harmful to the sight of the eyes. In order to eliminate this problem, a high frequency electronic ballast may be used. When a fluorescent or power-saving bulb is used with high frequency electronic ballast, it saves about 20% of the consumption of power and eliminates the problem of flashing. However, the high frequency electronic ballast is not detachable when installed in a fluorescent or power-saving bulb, the whole lamp assembly becomes useless if the bulb is damaged. Furthermore, because a fluorescent bulb contains a mercury coating, it may cause pollution to the environment when thrown away after damage. Hence, LED lamp or LED tube is created in order to solve the above-mentioned questions of the prior lamp.

SUMMARY OF THE INVENTION

In view of the aforementioned issues, the present invention provides a quasi-optical LED package structure for increasing color render index and brightness. The present invention provides an LED module with high color temperature and an LED module with low color temperature connected each other in series or in parallel in order to create the quasi-optical LED package structure with high color render index and brightness.

Moreover, the present invention can form an annular resin frame (such as an annular white resin frame) with any shapes by coating method. In addition, the position of a translucent package resin body such as phosphor resin can be limited in the resin position limiting space by using the annular resin frame, and the shape of the translucent package resin body can be adjusted by using the annular resin frame. Therefore, the present invention can apply to increase light-emitting efficiency of LED chips and control light-projecting angle of LED chips.

To achieve the above-mentioned objectives, the present invention provides a quasi-optical LED package structure for increasing color render index and brightness, including: a substrate unit, a light-emitting unit, a frame unit and a package unit. The substrate unit has at least one substrate body and at least two chip-placing areas formed on the at least one substrate body. The light-emitting unit has at least one first light-emitting module for generating a first color temperature and at least one second light-emitting module for generating a second color temperature. The at least one first light-emitting module has a plurality of first light-emitting chips electrically disposed on one of the chip-placing areas of the substrate unit, and the at least one second light-emitting module has a plurality of second light-emitting chips electrically disposed on the other chip-placing area of the substrate unit. The frame unit has at least two annular resin frames surroundingly formed on a top surface of the substrate body by coating. The at least two annular resin frames respectively surround the at least one first light-emitting module and the at least one second light-emitting module in order to form at least two resin position limiting spaces above the substrate body. The package unit has at least one first translucent package resin body and at least one second translucent package resin body both disposed on the substrate body and respectively covering the at least one first light-emitting module and the at least one second light-emitting module. The at least one first translucent package resin body and the at least one second translucent package resin body are limited in the at least two resin position limiting spaces.

To achieve the above-mentioned objectives, the present invention provides a quasi-optical LED package structure for increasing color render index and brightness, including: a substrate unit, a light-emitting unit, a frame unit and a package unit. The substrate unit has at least one substrate body and at least two chip-placing areas formed on the at least one substrate body. The light-emitting unit has at least one first light-emitting module for generating a first color temperature and at least one second light-emitting module for generating a second color temperature. The at least one first light-emitting module has a plurality of first light-emitting chips electrically disposed on one of the chip-placing areas of the substrate unit, and the at least one second light-emitting module has a plurality of second light-emitting chips electrically disposed on the other chip-placing area of the substrate unit. The frame unit has at least one first annular resin frame and at least one second annular resin frame surroundingly formed on a top surface of the substrate body by coating. The at least one first annular resin frame surrounds the at least one first light-emitting module in order to form at least one first resin position limiting space above the substrate body, and the at least one second annular resin frame surrounds the at least one second light-emitting module and the at least one first annular resin frame in order to form at least one second resin position limiting space above the substrate body and between the at least one first annular resin frame and the at least one second annular resin frame. The package unit has at least one first translucent package resin body and at least one second translucent package resin body both disposed on the substrate body and respectively covering the at least one first light-emitting module and the at least one second light-emitting module. The at least one first translucent package resin body is limited in the at least one first resin position limiting space, and the at least one second translucent package resin body is limited in the at least one second resin position limiting space.

To achieve the above-mentioned objectives, the present invention provides a quasi-optical LED package structure for increasing color render index and brightness, including: a substrate unit, a light-emitting unit, a frame unit and a package unit. The light-emitting unit has at least one first light-emitting module for generating a first color temperature and at least one second light-emitting module for generating a second color temperature. The at least one first light-emitting module has a plurality of first light-emitting chips electrically disposed on the substrate unit, and the at least one second light-emitting module has a plurality of second light-emitting chips electrically disposed on the substrate unit. The frame unit has at least one first annular resin frame and at least one second annular resin frame surroundingly formed on a top surface of the substrate unit. The at least one first annular resin frame surrounds the at least one first light-emitting module in order to form at least one first resin position limiting space above the substrate body, and the at least one second annular resin frame surrounds the at least one second light-emitting module and the at least one first annular resin frame in order to form at least one second resin position limiting space above the substrate body and between the at least one first annular resin frame and the at least one second annular resin frame. The package unit has at least one first translucent package resin body and at least one second translucent package resin body both disposed on the substrate body and respectively covering the at least one first light-emitting module and the at least one second light-emitting module. The at least one first translucent package resin body is limited in the at least one first resin position limiting space, and the at least one second translucent package resin body is limited in the at least one second resin position limiting space.

Hence, one light-emitting module with high color temperature and another light-emitting module with low color temperature both are connected each other in series or in parallel in order to create the quasi-optical LED package structure with high color render index and brightness.

Furthermore, the translucent package resin body is limited in the resin position limiting space by using the annular resin frame in order to control the usage quantity of the translucent package resin body. In addition, the surface shape and the height of the translucent package resin body can be adjusted by control the usage quantity of the translucent package resin body in order to adjust light-projecting angles of the white light beams. Moreover, the blue light beams generated by the LED chips can be reflected by an inner wall of the annular resin frame in order to increase the light-emitting efficiency of the LED package structure of the present invention.

In order to further understand the techniques, means and effects the present invention takes for achieving the prescribed objectives, the following detailed descriptions and appended drawings are hereby referred, such that, through which, the purposes, features and aspects of the present invention can be thoroughly and concretely appreciated; however, the appended drawings are provided solely for reference and illustration, without any intention that they be used for limiting the present invention.

DETAILED DESCRIPTION OF THE PREFERRED EMBODIMENTS

Figure 1A:
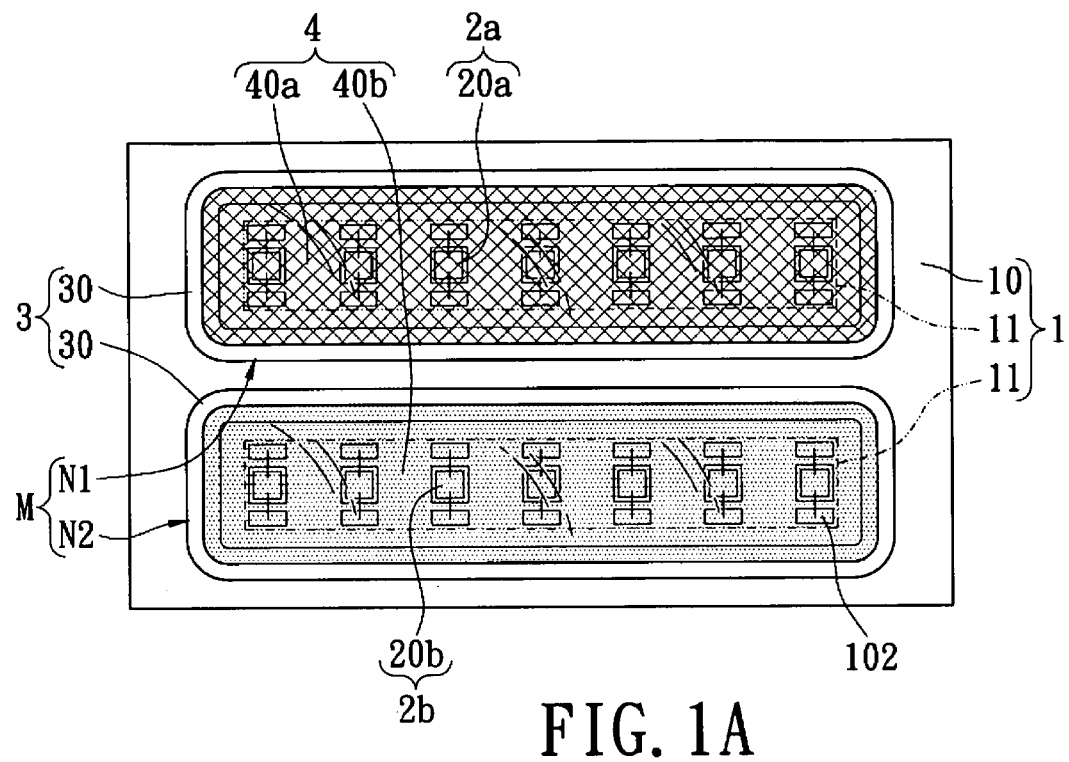
FIG. 1A is a top, schematic view of the quasi-optical LED package structure according to the first embodiment of the present invention.
Figure 1B:
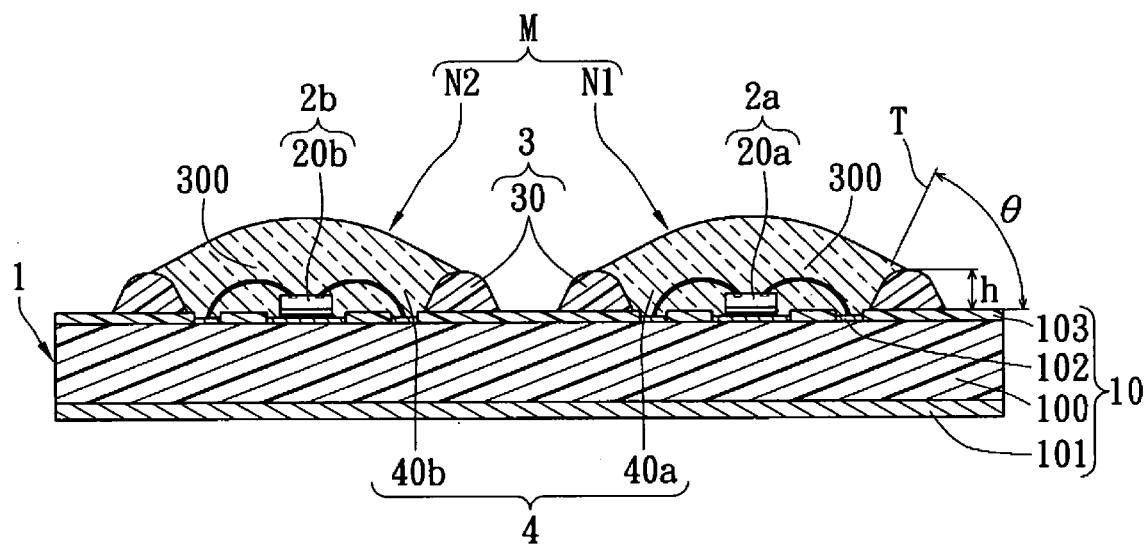
FIG. 1B is a lateral, cross-sectional, schematic view of the quasi-optical LED package structure according to the first embodiment of the present invention.

Referring to FIGS. 1A and 1B, the first embodiment of the present invention provides a quasi-optical LED package structure M for increasing color render index and brightness, including: a substrate unit 1, a light-emitting unit, a frame unit 3 and a package unit 4.

The substrate unit 1 has at least one substrate body 10 and at least two chip-placing areas 11 formed on the at least one substrate body 10. In addition, the substrate body 10 has a circuit substrate 100, a heat-dissipating layer 101 disposed on a bottom surface of the circuit substrate 100, a plurality conductive pads 102 disposed on a top surface of the circuit substrate 100, and an insulative layer 103 disposed on the top surface of the circuit substrate 100 in order to expose the conductive pads 102. Hence, the heat-dissipating efficiency of the circuit substrate 100 is increased by using the heat-dissipating layer 101, and the insulative layer 103 is a solder mask for exposing the conductive pads 102 only in order to achieve local soldering. However, the above-mentioned definition of the substrate body 10 does not limit the present invention. Any types of substrate can be applied to the present invention. For example, the substrate body 10 can be a PCB (Printed Circuit Board), a flexible substrate, an aluminum substrate, a ceramic substrate, or a copper substrate.

Moreover, the light-emitting unit has at least one first light-emitting module 2a for generating a first color temperature and at least one second light-emitting module 2b for generating a second color temperature. The first light-emitting module 2a has a plurality of first light-emitting chips (such as LED chips) 20a electrically disposed on one of the chip-placing areas 11 of the substrate unit 1, and the second light-emitting module 2b has a plurality of second light-emitting chips (such as LED chips) 20b electrically disposed on the other chip-placing area 11 of the substrate unit 1. In other words, In other words, designer can plan at least two predetermined chip-placing areas 11 on the substrate unit 1 in advance, so that the first light-emitting chips 20a and the second light-emitting chips 20b can be respectively placed on the two chip-placing areas 11 of the substrate unit 1. In the first embodiment, the first light-emitting chips 20a and the second light-emitting chips 20b are respectively electrically disposed on the two chip-placing areas 11 of the substrate unit 1 by wire bonding.

Furthermore, the frame unit 3 has at least two annular resin frames 30 surroundingly formed on a top surface of the substrate body 10 by coating. The two annular resin frames 30 respectively surround the first light-emitting module 2a and the second light-emitting module 2b in order to form at least two resin position limiting spaces 300 above the substrate body 10. In addition, the two annular resin frames 30 are selectively separated from each other or connected with each other, and the two annular resin frames 30 are disposed on the substrate body 10 in series or in parallel, according to different requirements. In the first embodiment, the two annular resin frames 30 are separated from each other by a predetermined distance, and the two annular resin frames 30 are disposed on the substrate body 10 in parallel.

Each annular resin frame 30 has an arc shape formed on a top surface thereof. Each annular resin frame 30 has a radius tangent T and the angle θ of the radius tangent T relative to the top surface of the substrate body 10 is between 40° C. and 50° C. The maximum height of each annular resin frame 30 relative to the top surface of the substrate body 10 is between 0.3 mm and 0.7 mm. The width of a bottom side of each annular resin frame 30 is between 1.5 mm and 3 mm. The thixotropic index of each annular resin frame 30 is between 4 and 6, and each annular resin frame 30 is a white thermohardening resin frame (opaque resin frame) mixed with inorganic additive.

The method for forming each annular resin frame 30 includes: first, surroundingly coating liquid resin (not shown) on the top surface of the substrate body 10. In addition, the liquid resin can be coated on the substrate body 10 by any shapes according to different requirements (such as a circular shape, a square or a rectangular shape etc.). The thixotropic index of the liquid resin is between 4 and 6, the pressure of coating the liquid resin on the top surface of the substrate body 10 is between 350 kpa and 450 kpa, and the velocity of coating the liquid resin on the top surface of the substrate body 10 is between 5 mm/s and 15 mm/s. The liquid resin is surroundingly coated on the top surface of the substrate body 10 from a start point to a termination point, and the position of the start point and the position of the termination point are the same. Furthermore, the method further includes: hardening the liquid resin to form an annular resin frame 30, and the annular resin frame 30 surrounding the light-emitting chips (20a or 20b) that are disposed on the chip-placing area 11 to form a resin position limiting space 300 above the substrate body 10. In addition, the liquid resin is hardened by baking, the baking temperature is between 120° C. and 140° C., and the baking time is between 20 minute and 40 minute.

Moreover, the package unit 4 has at least one first translucent package resin body 40a and at least one second translucent package resin body 40b both disposed on the substrate body 10 and respectively covering the first light-emitting module 2a and the second light-emitting module 2b. The first translucent package resin body 40a and the second translucent package resin body 40b are limited in the two resin position limiting spaces 300. In addition, the top surface of the first translucent package resin body 40a and the top surface of the second translucent package resin body 40b are convex surfaces.

In the first embodiment, the light wavelengths of each first light-emitting chips 20a and each second light-emitting chip 20b can be between 400 nm and 500 nm.

In addition, each first light-emitting chip 20a is a blue light-emitting chip, the first translucent package resin body 40a is a phosphors with a first color, and light beams generated by the blue light-emitting chips pass through the first translucent package resin body 40a for generating yellow beams about 3500 color temperature. Moreover, one part of the above-mentioned elements is combined to form a first light-emitting structure N1 that is composed of the substrate body 10, the first light-emitting chips 20a, the annular resin frame 30 and the first translucent package resin body 40a.

In addition, each second light-emitting chip 20b is a blue light-emitting chip, the second translucent package resin body 40b is a phosphors with a second color, and light beams generated by the blue light-emitting chips pass through the second translucent package resin body 40b for generating white beams about 6500 color temperature. Moreover, one part of the above-mentioned elements is combined to form a second light-emitting structure N2 that is composed of the substrate body 10, the second light-emitting chips 20a, the annular resin frame 30 and the second translucent package resin body 40b.

Furthermore, the first light-emitting structure N1 and the second light-emitting structure N2 can share the substrate unit 1 as shown in the first embodiment or use different substrate units. The first light-emitting structure N1 and the second light-emitting structure N2 are combined to form the quasi-optical LED package structure M of the present invention.

The first embodiment provides an electric current of 200 milliampere (mA) for the first light-emitting structure N1 (3500K), the second light-emitting structure N2 (6500K), and the quasi-optical LED package structure M (3500K+6500K), and the relevant measurement results are shown in the following table:

| Group | N1 | N2 | M |
|---|---|---|---|
| Luminous flux | 110.457 | 184.166 | 156.138 |
| Luminous efficiency | 46.01 | 77.1 | 69.24 |

-continued

| Group | N1 | N2 | M |
|---|---|---|---|
| CIE x | 0.3799 | 0.3118 | 0.3407 |
| CIE y | 0.3137 | 0.3388 | 0.3345 |
| CCT | 3390.4 | 6478.9 | 5125.2 |
| Color render index | 82.543 | 75.893 | 83.142 |

The unit of luminous flux is lumen; the unit of luminous efficiency is lumen/W; CIE x and CIE y respectively are x and y coordinates in xy chromaticity diagram of CIE (International Commission on Illumination); the unit of CCT (Correlated Color Temperature) is Kelvin (K); the unit of color render index is Rendering average (Ra).

Figure 1C:
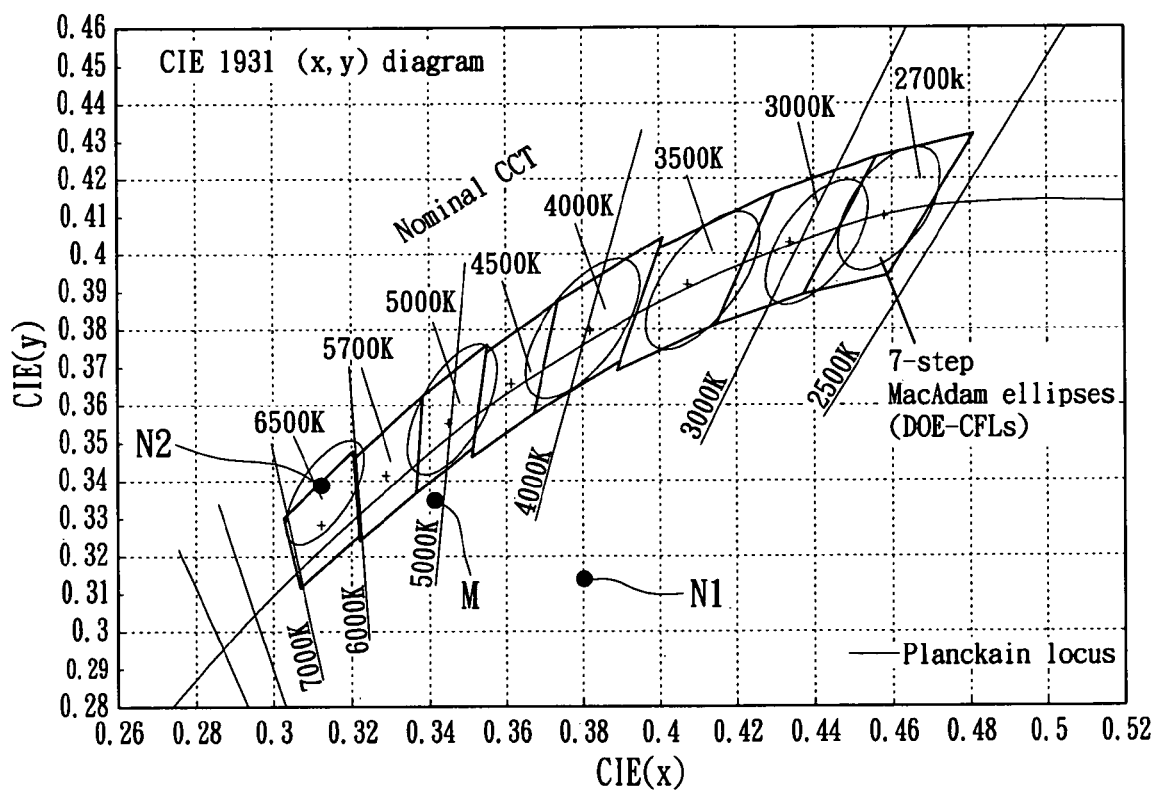
FIG. 1C is a xy chromaticity diagram of the quasi-optical LED package structure according to the first embodiment of the present invention.

Referring to FIG. 1C and the above-mentioned table, the first color temperature generated by the first light-emitting module 2a is smaller than the second color temperature generated by the second light-emitting module 2b. It means that 3500K temperature color of the yellow beams generated by the first light-emitting structure N1 is smaller than 6500K temperature color of the white beams generated by the second light-emitting structure N2. In addition, when the yellow beams and the white beams are mixed, the quasi-optical LED package structure M of the first embodiment can generate good light blending effect as shown in the above-mentioned table.

Figure 2A:
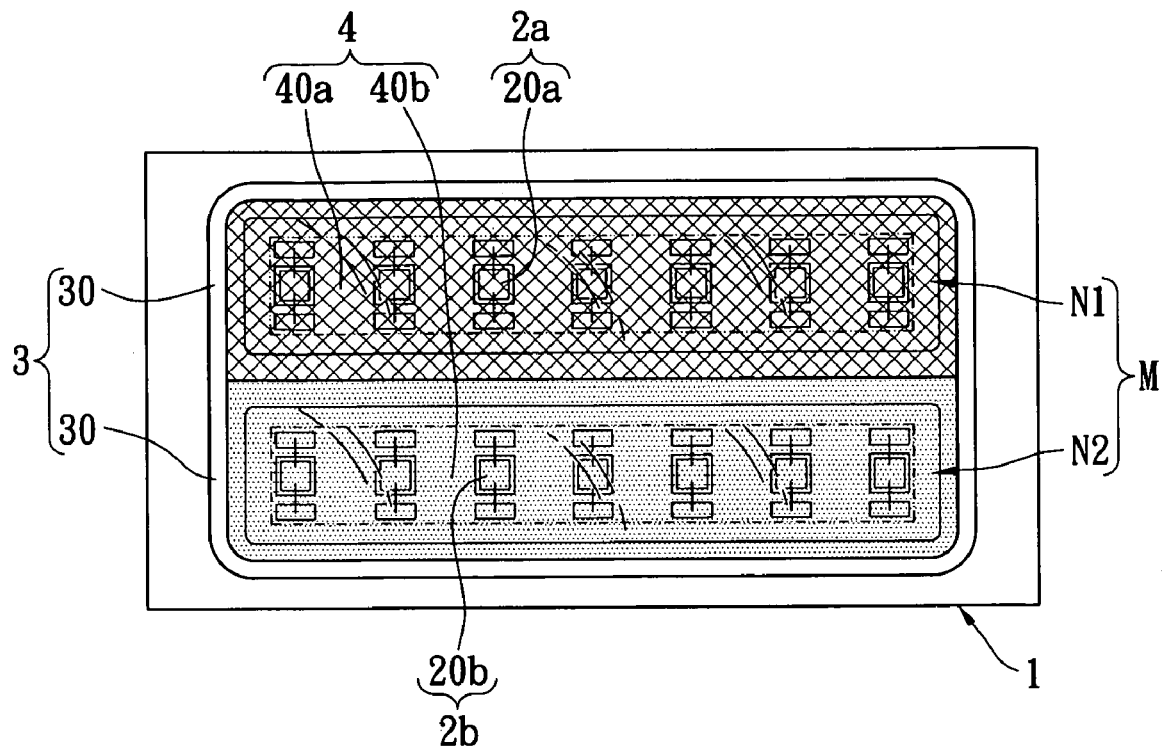
FIG. 2A is a top, schematic view of the quasi-optical LED package structure according to the second embodiment of the present invention.
Figure 2B:
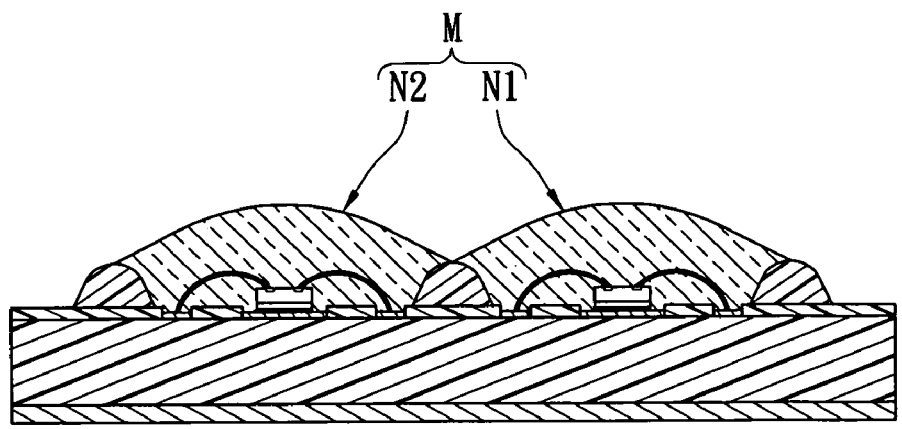
FIG. 2B is a lateral, cross-sectional, schematic view of the quasi-optical LED package structure according to the second embodiment of the present invention.

Referring to FIGS. 2A and 2B, the second embodiment of the present invention provides a quasi-optical LED package structure M for increasing color render index and brightness, including: a substrate unit 1, a light-emitting unit, a frame unit 3 and a package unit 4. The light-emitting unit has at least one first light-emitting module 2a for generating a first color temperature and at least one second light-emitting module 2b for generating a second color temperature. The difference between the second embodiment and the first embodiment is that: in the second embodiment, the two annular resin frames 30 are connected with each other in series.

The second embodiment provides four sets of electric current for the first light-emitting structures N1 (3500K) and the second light-emitting structure N2 (6500K) in order to form four sets of quasi-optical LED package structures (A, B, C, D), and the relevant measurement results are shown in the following table:

| | Quasi-optical LED package structure | | | |
|---|---|---|---|---|
| | A | B | C | D |
| Electric current for N1 | 100 mA | 200 mA | 200 mA | 300 mA |
| Electric current for N2 | 200 mA | 100 mA | 200 mA | 200 mA |
| CIE x | 0.311 | 0.348 | 0.338 | 0.343 |

-continued

| | Quasi-optical LED package structure | | | |
|---|---|---|---|---|
| | A | B | C | D |
| CIE y | 0.320 | 0.319 | 0.322 | 0.317 |
| CCT | 6677.2 | 4707.76 | 5195.9 | 4962.1 |
| Color render index | 74.3 | 84.4 | 81.4 | 83.6 |

Figure 2C:
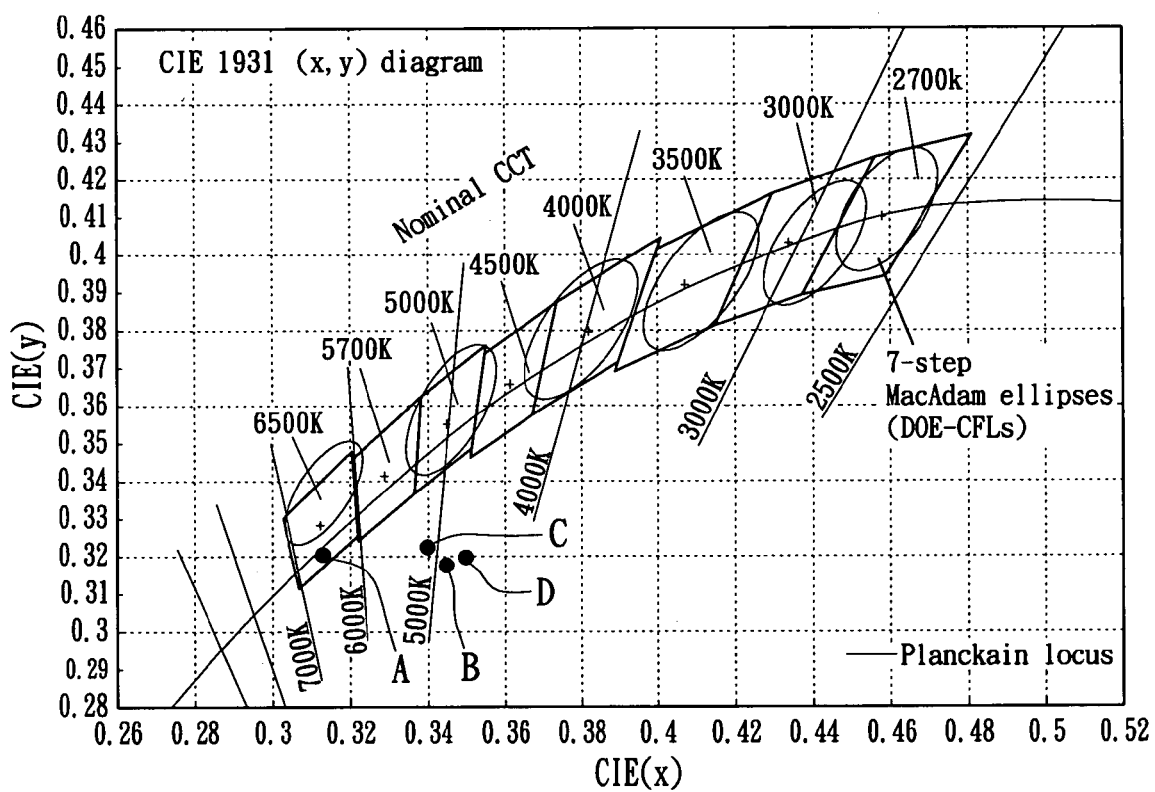
FIG. 2C is a xy chromaticity diagram of the quasi-optical LED package structure according to the second embodiment of the present invention.

Referring to FIG. 2C and the above-mentioned table, when the 3500K temperature color of the yellow beams generated by the first light-emitting structure N1 and the 6500K temperature color of the white beams generated by the second light-emitting structure N2 are mixed, the quasi-optical LED package structure M of the second embodiment can generate good light blending effect as shown in the above-mentioned table.

Figure 2D:
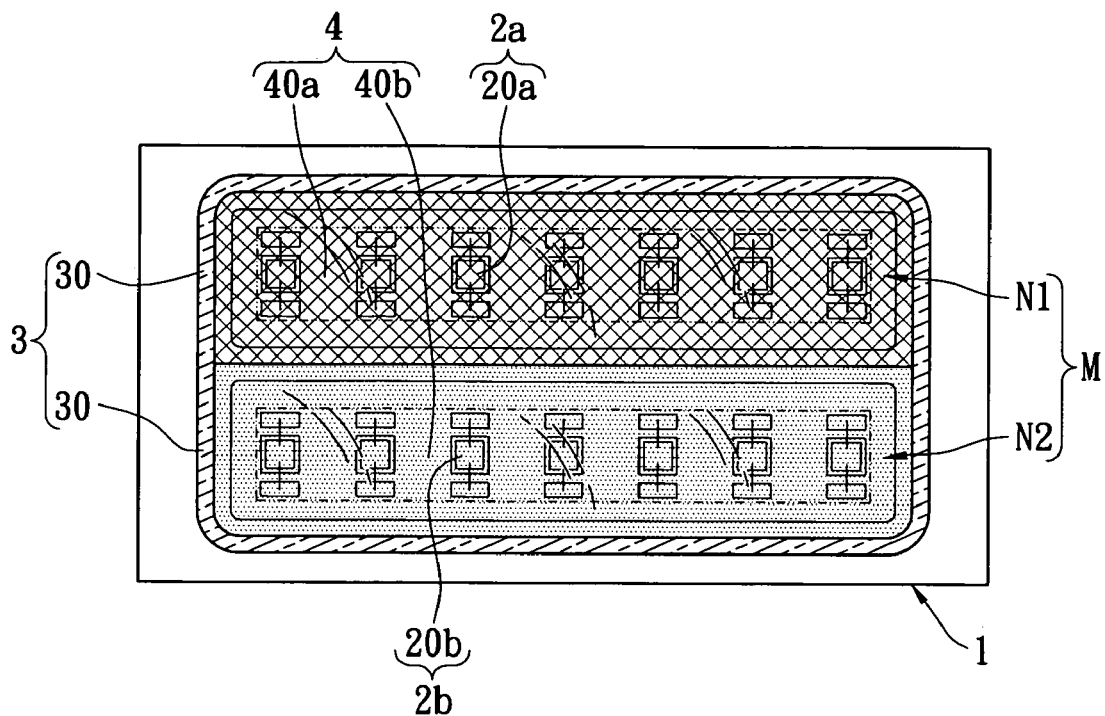
FIG. 2D is a top, schematic view of the quasi-optical LED package structure according to another second embodiment of the present invention.
Figure 2E:
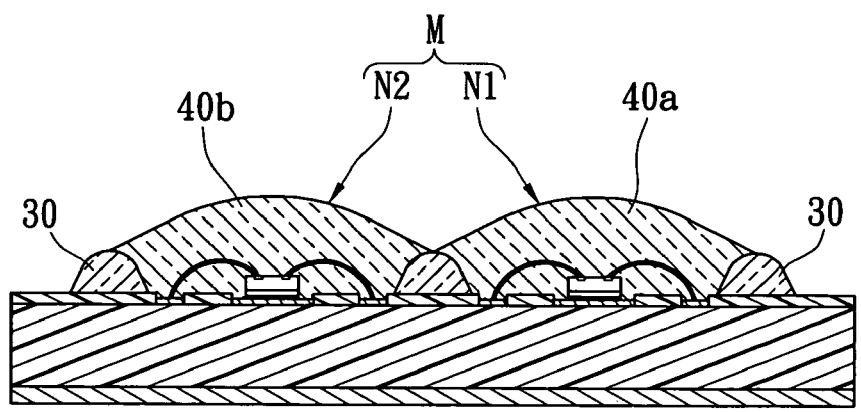
FIG. 2E is a lateral, cross-sectional, schematic view of the quasi-optical LED package structure according to another second embodiment of the present invention.

Referring to FIGS. 2D and 2E, each annular resin frame 30 can be a phosphor resin. In other words, phosphor powders can be selectively add to each annular resin frame 30 according to different requirements in order to decrease dark bands that are generated between the first translucent package resin body 40a and the second translucent package resin body 40b.

Referring to FIGS. 3A to 3E, the third embodiment of the present invention provides five sets of quasi-optical LED package structures (M1 to M5), and each quasi-optical LED package structure (M1 to M5) is composed of a first light-emitting structure N1 and a second light-emitting structure N2.

For example, the first set of quasi-optical LED package structure M1 is composed of a first light-emitting structure N1 and a second light-emitting structure N2 that are connected in series. The second set of quasi-optical LED package structure M2 is composed of two first light-emitting structures N1 and two second light-emitting structures N2 that are alternatively connected in series. The third set of quasi-optical LED package structure M3 is composed of two second light-emitting structures N2 and two first light-emitting structures N1 that are alternatively connected in series. The fourth set of quasi-optical LED package structure M4 is composed of two first light-emitting structures N1 and a second light-emitting structure N2 that are connected in series, and the second light-emitting structures N2 is arranged between the two first light-emitting structures N1. The fifth set of quasi-optical LED package structure M5 is composed of a first light-emitting structure N1 and two second light-emitting structures N2 that are connected in series, and the first light-emitting structures N1 is arranged between the two second light-emitting structures N2.

The three embodiment provides an electric current of 200 milliampere (mA) for the first light-emitting structure N1 (3500K), the second light-emitting structure N2 (6500K), and five groups of the quasi-optical LED package structures M1~M5 (3500K+6500K), and the relevant measurement results are shown in the following table:

| Group | N1 | N2 | M1 | M2 | M3 | M4 | M5 |
|---|---|---|---|---|---|---|---|
| Luminous flux | 105.68 | 146.44 | 124.10 | 122.60 | 130.72 | 143.25 | 112.60 |
| Luminous efficiency | 43.745 | 60.544 | 51.316 | 49.884 | 53.496 | 59.199 | 46.686 |
| CIE x | 0.381 | 0.311 | 0.367 | 0.367 | 0.362 | 0.351 | 0.343 |
| CIE y | 0.338 | 0.344 | 0.381 | 0.374 | 0.374 | 0.374 | 0.323 |
| CCT | 3644.7 | 6509.9 | 4418.1 | 4379.9 | 4528.8 | 4887.3 | 4987.1 |
| Color render index | 81.206 | 77.290 | 78.559 | 78.606 | 78.639 | 76.730 | 84.692 |

Figure 3A:
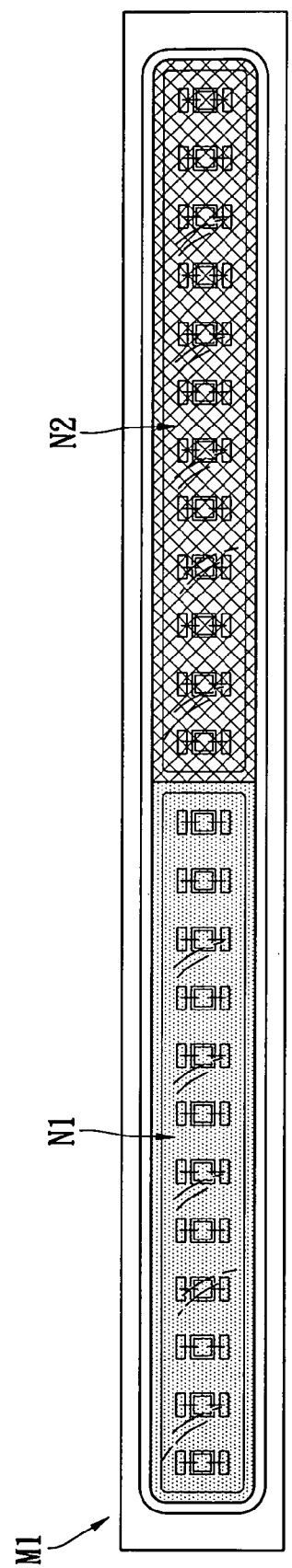
FIG. 3A is a top, schematic view of the quasi-optical LED package structure using first type of series method according to the third embodiment of the present invention.
Figure 3B:
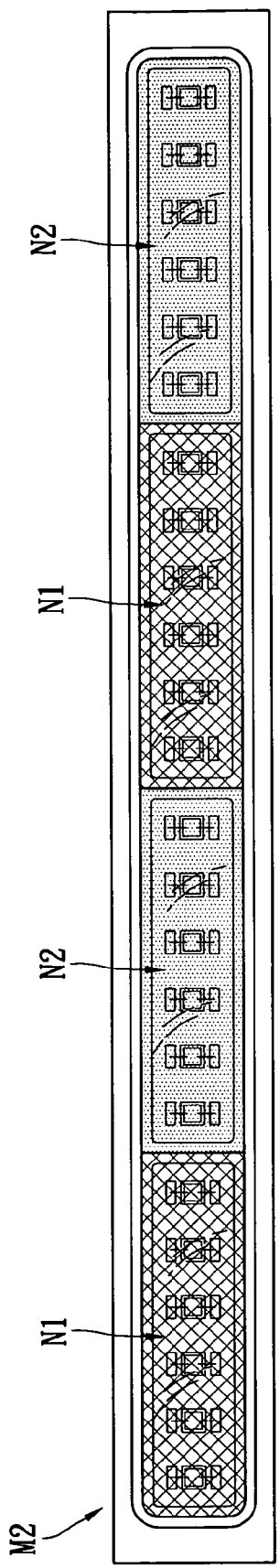
FIG. 3B is a top, schematic view of the quasi-optical LED package structure using second type of series method according to the third embodiment of the present invention.
Figure 3C:
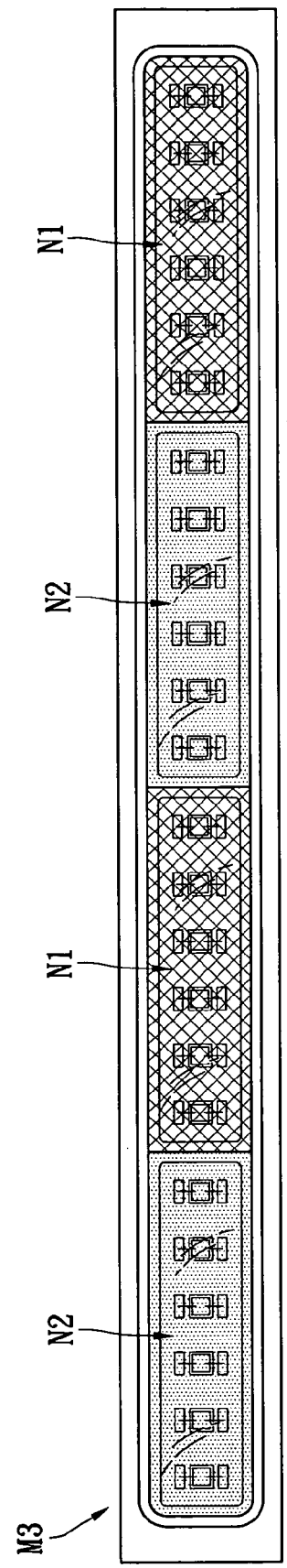
FIG. 3C is a top, schematic view of the quasi-optical LED package structure using third type of series method according to the third embodiment of the present invention.
Figure 3D:
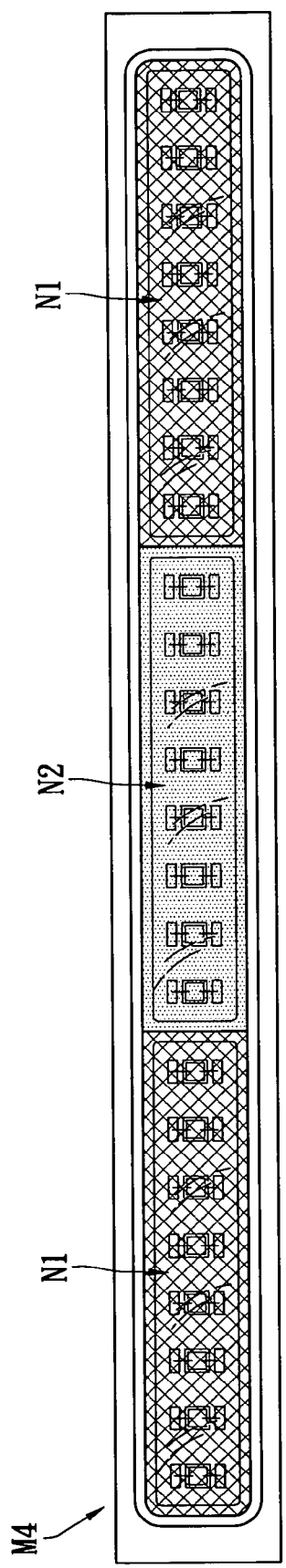
FIG. 3D is a top, schematic view of the quasi-optical LED package structure using fourth type of series method according to the third embodiment of the present invention.
Figure 3E:
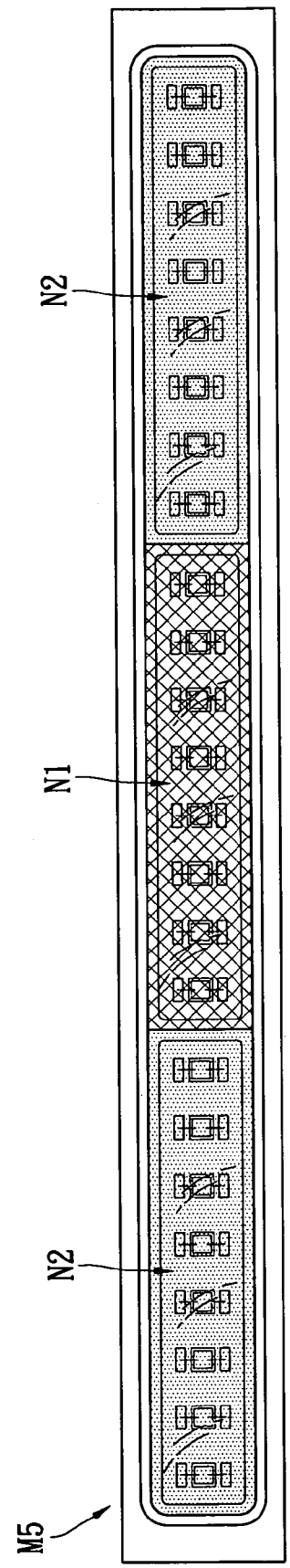
FIG. 3E is a top, schematic view of the quasi-optical LED package structure using fifth type of series method according to the third embodiment of the present invention.
Figure 3F:
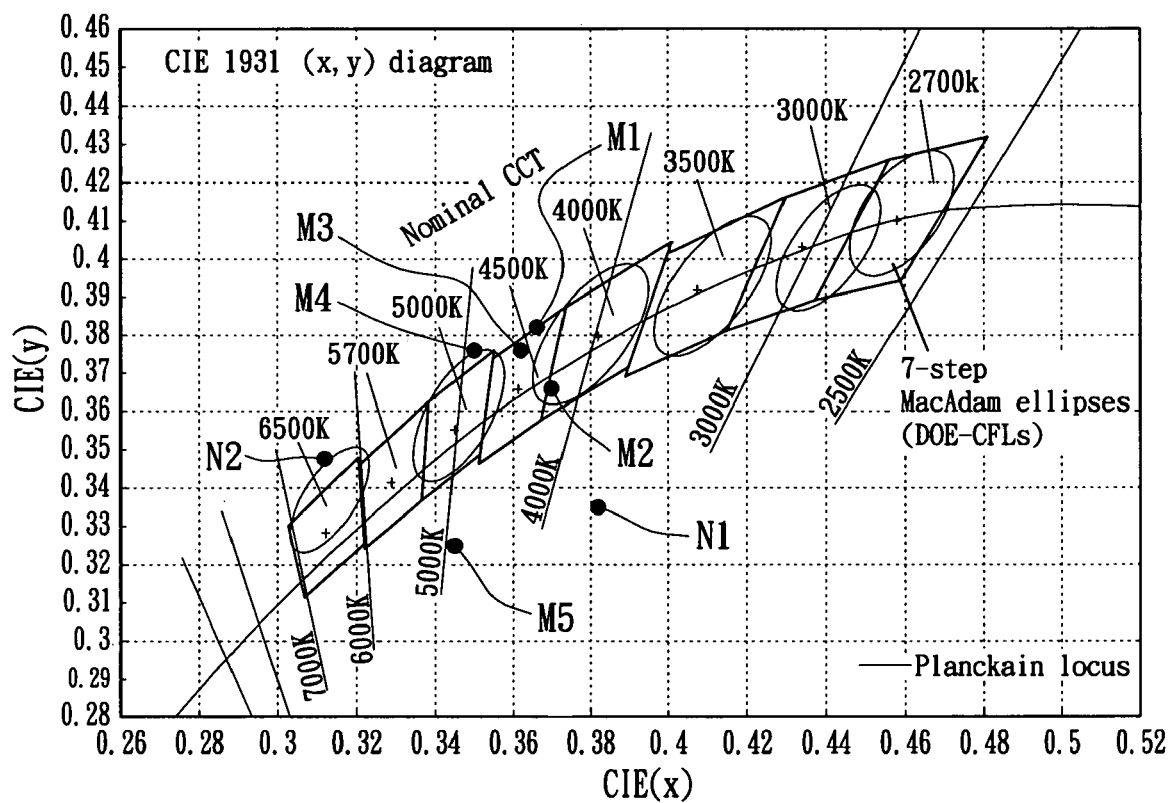
FIG. 3F is a xy chromaticity diagram of the quasi-optical LED package structure using five types of series methods according to the third embodiment of the present invention.

Referring to FIG. 3F and the above-mentioned table, when the 3500K temperature color of the yellow beams generated by the first light-emitting structure N1 and the 6500K temperature color of the white beams generated by the second light-emitting structure N2 are mixed, the five groups of the quasi-optical LED package structures (M1, M2, M3, M4, M5) of the third embodiment can generate good light blending effect as shown in the above-mentioned table.

Figure 3G:
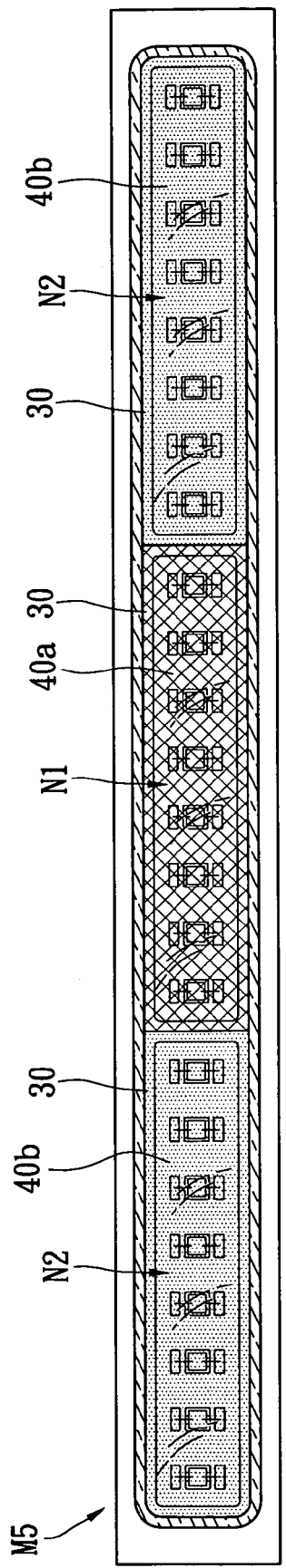
FIG. 3G is a top, schematic view of the quasi-optical LED package structure using sixth type of series method according to the third embodiment of the present invention.

Referring to FIG. 3G, each annular resin frame 30 can be a phosphor resin. In other words, phosphor powders can be selectively add to each annular resin frame 30 according to different requirements in order to decrease dark bands that are generated between the first translucent package resin body 40a and the second translucent package resin body 40b.

Figure 4A:
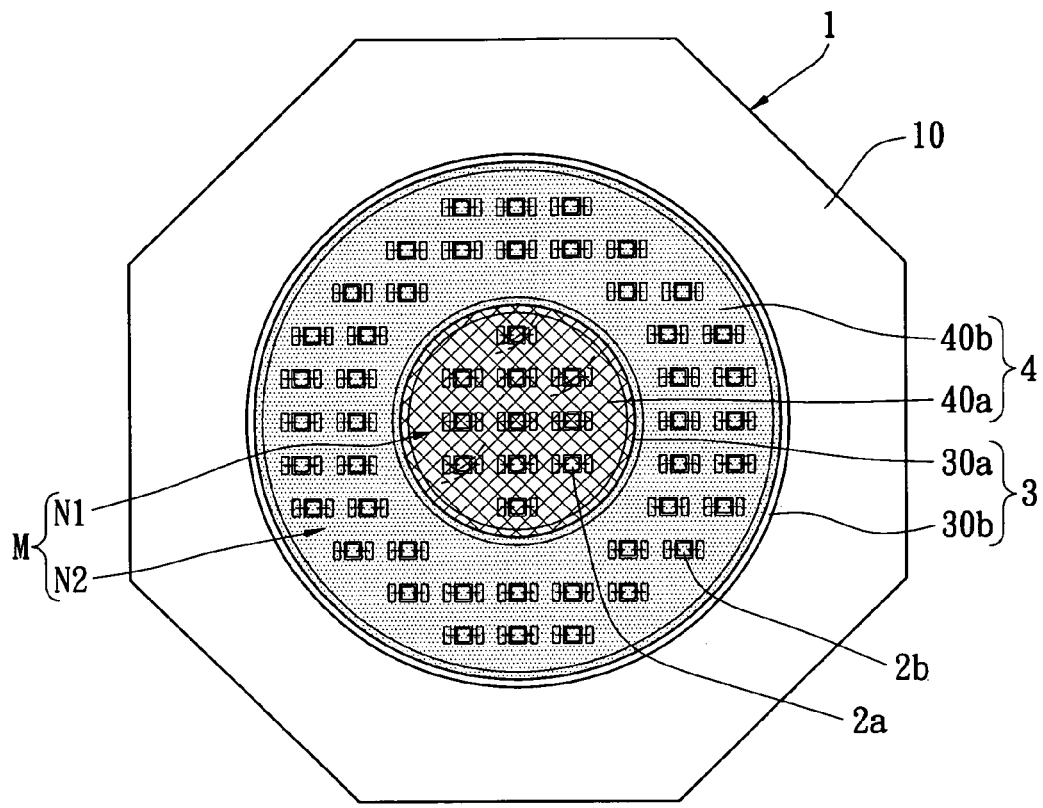
FIG. 4A is a top, schematic view of the quasi-optical LED package structure according to the fourth embodiment of the present invention.
Figure 4B:
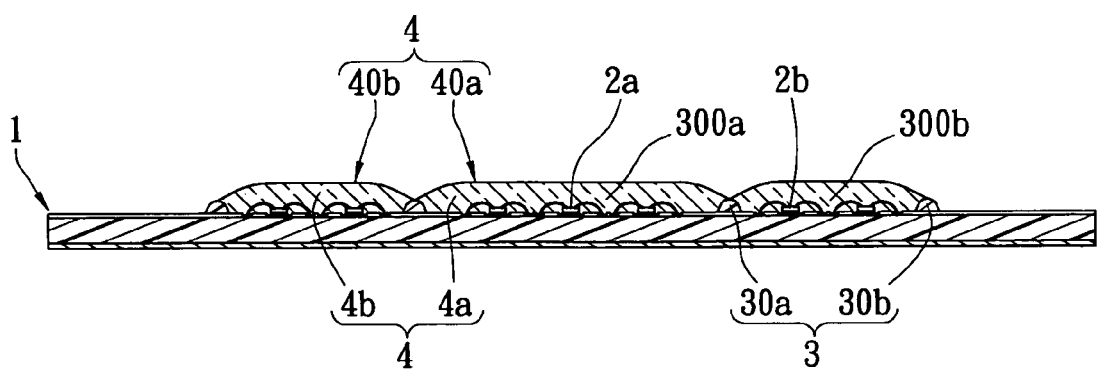
FIG. 4B is a lateral, cross-sectional, schematic view of the quasi-optical LED package structure according to the fourth embodiment of the present invention.

Referring to FIGS. 4A and 4B, the fourth embodiment of the present invention provides a quasi-optical LED package structure M for increasing color render index and brightness, including: a substrate unit 1, a light-emitting unit, a frame unit 3 and a package unit 4.

The difference between the fourth embodiment and the first embodiment is that: in the fourth embodiment, the frame unit 3 has at least one first annular resin frame 30a and at least one second annular resin frame 30b surroundingly formed on a top surface of the substrate body 10 by coating. In addition, the first annular resin frame 30a surrounds the first light-emitting module 20a in order to form at least one first resin position limiting space 300a above the substrate body 10, and the second annular resin frame 30b surrounds the second light-emitting module 2b and the first annular resin frame 30a in order to form at least one second resin position limiting space 300b above the substrate body 10 and between the first annular resin frame 30a and the second annular resin frame 30b.

Moreover, the package unit 4 has at least one first translucent package resin body 40a and at least one second translucent package resin body 40b both disposed on the substrate body 10 and respectively covering the first light-emitting module 2a and the second light-emitting module 2b. The first translucent package resin body 40a is limited in the first resin position limiting space 300a, and the second translucent package resin body 40b is limited in the second resin position limiting space 300b. In addition, the first annular resin frame 30a and the second annular resin frame 30b are arranged as concentric circles, and the second light-emitting module 2b is disposed between the first annular resin frame 30a and the second annular resin frame 30b.

Furthermore, the first annular resin frame 30a has an arc shape formed on a top surface thereof. The first annular resin frame 30a has a radius tangent T and the angle θ of the radius tangent T relative to the top surface of the substrate body 10 is between 40° C. and 50° C. The maximum height of the first annular resin frame 30a relative to the top surface of the substrate body 10 is between 0.3 mm and 0.7 mm. The width of a bottom side of the first annular resin frame 30a is between 1.5 mm and 3 mm. The thixotropic index of the first annular resin frame 30a is between 4 and 6, and the first annular resin frame 30a is a white thermohardening resin frame mixed with inorganic additive.

In addition, the second annular resin frame 30b has an arc shape formed on a top surface thereof. The second annular resin frame 30b has a radius tangent T and the angle θ of the radius tangent T relative to the top surface of the substrate body 10 is between 40° C. and 50° C. The maximum height of the second annular resin frame 30b relative to the top surface of the substrate body 10 is between 0.3 mm and 0.7 mm. The width of a bottom side of the second annular resin frame 30b is between 1.5 mm and 3 mm. The thixotropic index of the second annular resin frame 30b is between 4 and 6, and the second annular resin frame 30b is a white thermohardening resin frame mixed with inorganic additive.

The fourth embodiment provides an electric current of 700 milliampere (mA) for the first light-emitting structure N1 (3500K), the second light-emitting structure N2 (6500K), and two groups of the quasi-optical LED package structures M (3500K+6500K). In addition, the radius of the first annular resin frame 30a of the first light-emitting structure N1 in Group A is 11 mm, and the radius of the first annular resin frame 30a of the first light-emitting structure N1 in Group B is 14 mm. The relevant measurement results are shown in the following table:

| Group | N1 | N2 | A(r = 11) | B(r = 14) |
|---|---|---|---|---|
| Luminous flux | 340.803 | 520.119 | 506.553 | 421.540 |
| Luminous efficiency | 40.357 | 62.039 | 60.540 | 50.257 |
| CIE x | 0.3656 | 0.3126 | 0.3198 | 0.3381 |
| CIE y | 0.3116 | 0.3530 | 0.3104 | 0.3119 |
| CCT | 3882.6 | 6355.9 | 6226.5 | 5180.5 |
| Color render index | 82.575 | 75.726 | 83.940 | 85.516 |

Figure 4C:
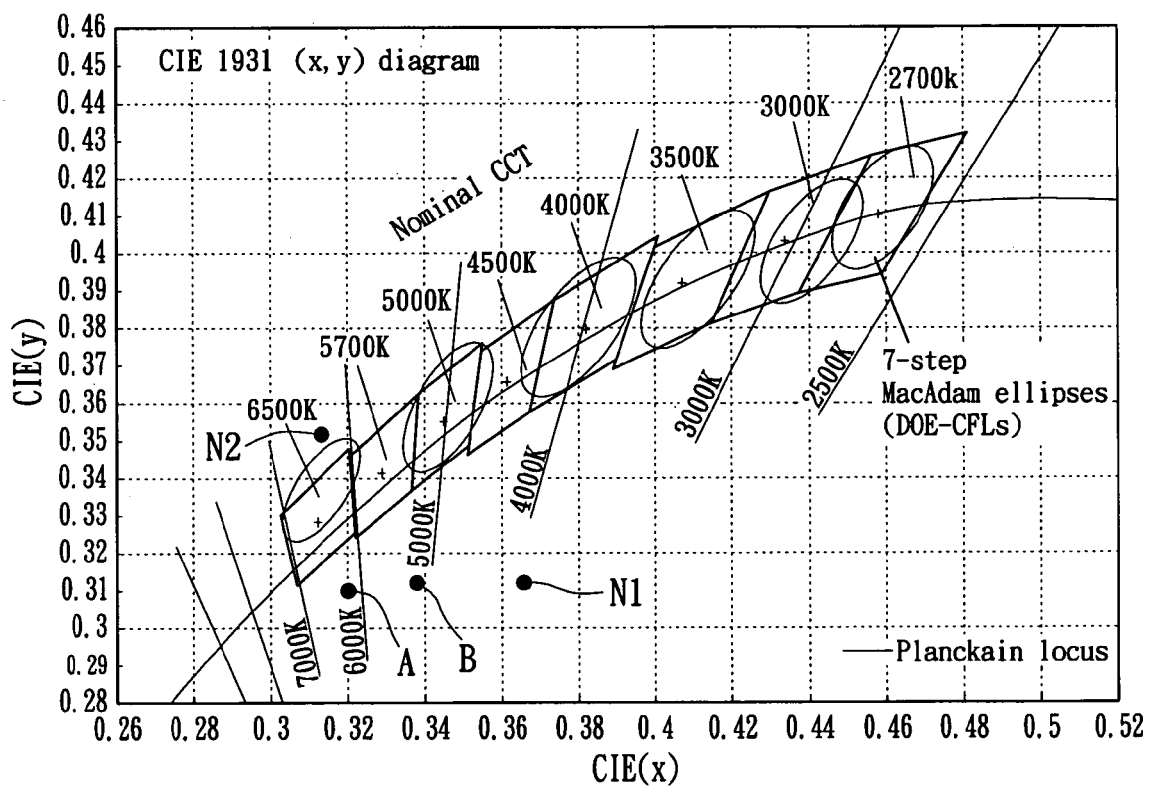
FIG. 4C is a xy chromaticity diagram of the quasi-optical LED package structure according to the fourth embodiment of the present invention.

Referring to FIG. 4C and the above-mentioned table, when the 3500K temperature color of the yellow beams generated by the first light-emitting structure N1 and the 6500K temperature color of the white beams generated by the second light-emitting structure N2 are mixed, the two groups (A, B) of the quasi-optical LED package structures M of the fourth embodiment can generate good light blending effect as shown in the above-mentioned table.

Figure 5:
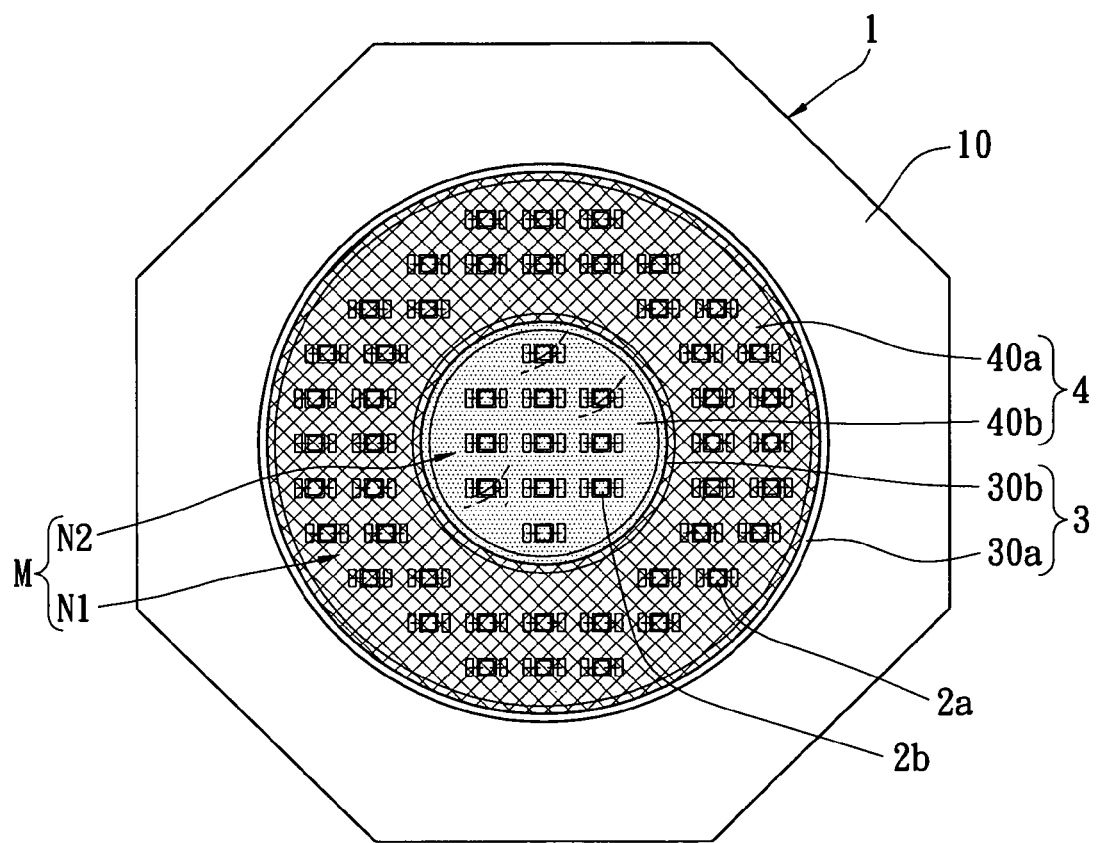
FIG. 5 is a top, schematic view of the quasi-optical LED package structure according to the fifth embodiment of the present invention.

Referring to FIG. 5, the fifth embodiment of the present invention provides a quasi-optical LED package structure M for increasing color render index and brightness. The quasi-optical LED package structure M is composed of a first light-emitting structure N1 and a second light-emitting structure N2. In addition, the difference between the fifth embodiment and the fourth embodiment is that: in the fifth embodiment, the first light-emitting structure N1 is an outer ring to surround the second light-emitting structure N2. Hence, the second light-emitting structure N2 with high color temperature can be an outer ring to surround the first light-emitting structure N1 with low color temperature (as shown in the fourth embodiment) or the first light-emitting structure N1 with low color temperature can be an outer ring to surround the second light-emitting structure N2 with high color temperature (as shown in the fifth embodiment) according to different requirements.

Figure 6A:
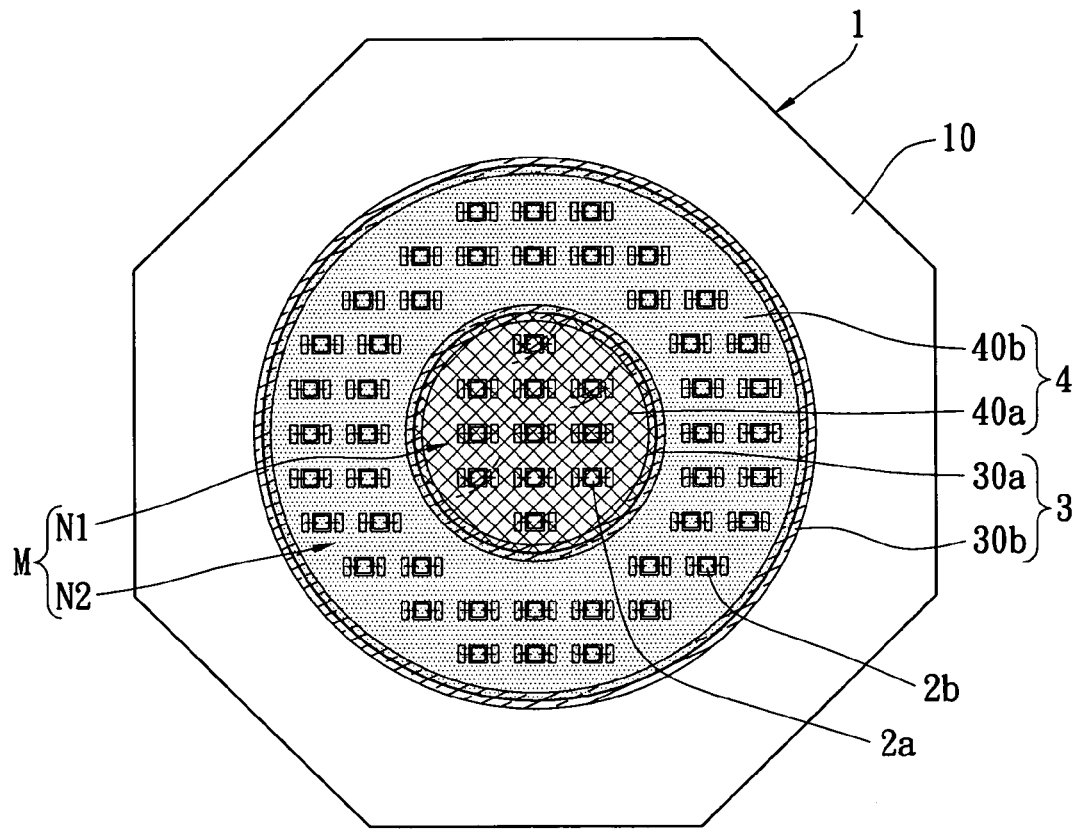
FIG. 6A is a top, schematic view of the quasi-optical LED package structure according to the sixth embodiment of the present invention.
Figure 6B:
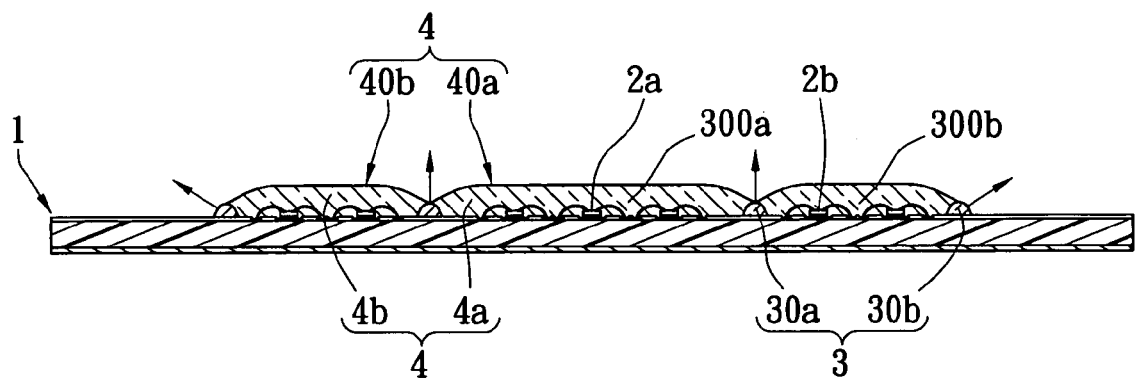
FIG. 6B is a lateral, cross-sectional, schematic view of the quasi-optical LED package structure according to the sixth embodiment of the present invention.

Referring to FIGS. 6A and 6B, the sixth embodiment of the present invention provides a quasi-optical LED package structure M for increasing color render index and brightness, including: a substrate unit 1, a light-emitting unit, a frame unit 3 and a package unit 4. The difference between the sixth embodiment and the fourth embodiment is that: in the sixth embodiment, the first annular resin frame 30a and the second annular resin frame 30b both are phosphor resins. In other words, phosphor powders can be selectively add to the first annular resin frame 30a and the second annular resin frame 30b according to different requirements in order to decrease dark bands that are generated between the first translucent package resin body 40a and the second translucent package resin body 40b.

Figure 7:
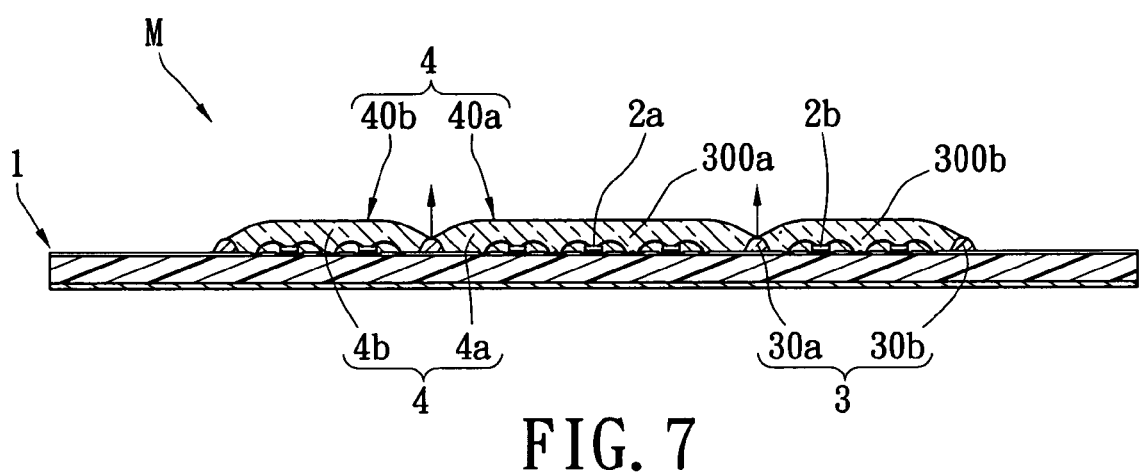
FIG. 7 is a lateral, cross-sectional, schematic view of the quasi-optical LED package structure according to the seventh embodiment of the present invention.

Referring to FIG. 7, the seventh embodiment of the present invention provides a quasi-optical LED package structure M for increasing color render index and brightness, including: a substrate unit 1, a light-emitting unit, a frame unit 3 and a package unit 4. The difference between the seventh embodiment and the fourth embodiment is that: in the sixth embodiment, the first annular resin frame 30a is a phosphor resin, and the second annular resin frame 30b is a light reflecting resin. In other words, phosphor powders can be selectively add to the first annular resin frame 30a according to different requirements in order to decrease dark bands that are generated between the first translucent package resin body 40a and the second translucent package resin body 40b. In addition, light beams generated from the quasi-optical LED package structure M can be condensed by the second annular resin frame 30b.

In conclusion, one light-emitting module with high color temperature and another light-emitting module with low color temperature both are connected each other in series or in parallel in order to create the quasi-optical LED package structure with high color render index and brightness.

Furthermore, the present invention can form an annular resin frame (such as an annular white resin frame) with any shapes by coating method. In addition, the position of a translucent package resin body such as phosphor resin can be limited in the resin position limiting space by using the annular resin frame, and the shape of the translucent package resin body can be adjusted by using the annular resin frame. Therefore, the present invention can apply to increase light-emitting efficiency of LED chips and control light-projecting angle of LED chips. In other words, the translucent package resin body is limited in the resin position limiting space by using the annular resin frame in order to control the usage quantity of the translucent package resin body. In addition, the surface shape and the height of the translucent package resin body can be adjusted by control the usage quantity of the translucent package resin body in order to adjust light-projecting angles of the white light beams. Moreover, the blue light beams generated by the LED chips can be reflected by an inner wall of the annular resin frame in order to increase the light-emitting efficiency of the LED package structure of the present invention.

The above-mentioned descriptions merely represent solely the preferred embodiments of the present invention, without any intention or ability to limit the scope of the present invention which is fully described only within the following claims. Various equivalent changes, alterations or modifications based on the claims of present invention are all, consequently, viewed as being embraced by the scope of the present invention.

What is claimed is:

1. A quasi-optical LED package structure for increasing color render index and brightness, comprising:
 a substrate unit having at least one substrate body and at least two chip-placing areas formed on the at least one substrate body;
 a light-emitting unit having at least one first light-emitting module for generating a first color temperature and at least one second light-emitting module for generating a second color temperature, wherein the at least one first light-emitting module has a plurality of first light-emitting chips electrically disposed on one of the chip-placing areas of the substrate unit, and the at least one second light-emitting module has a plurality of second light-emitting chips electrically disposed on the other chip-placing area of the substrate unit;
 a frame unit having at least two annular resin frames surroundingly formed on a top surface of the substrate body by coating, wherein the at least two annular resin frames respectively surround the at least one first light-emitting module and the at least one second light-emitting module in order to form at least two resin position limiting spaces above the substrate body; and
 a package unit having at least one first translucent package resin body and at least one second translucent package resin body both disposed on the substrate body and respectively covering the at least one first light-emitting module and the at least one second light-emitting module, wherein the at least one first translucent package resin body and the at least one second translucent package resin body are limited in the at least two resin position limiting spaces.

2. The quasi-optical LED package structure according to claim 1, wherein the substrate body has a circuit substrate, a heat-dissipating layer disposed on a bottom surface of the circuit substrate, a plurality conductive pads disposed on a top surface of the circuit substrate, and an insulative layer disposed on the top surface of the circuit substrate in order to expose the conductive pads.

3. The quasi-optical LED package structure according to claim 1, wherein each first light-emitting chip is a blue light-emitting chip, the at least one first translucent package resin body is a phosphors with a first color, and light beams generated by the blue light-emitting chips pass through the at least one first translucent package resin body for generating yellow beams about 3500 K color temperature, wherein each second light-emitting chip is a blue light-emitting chip, the at least one second translucent package resin body is a phosphors with a second color, and light beams generated by the blue light-emitting chips pass through the at least one second translucent package resin body for generating white beams about 6500 K color temperature.

4. The quasi-optical LED package structure according to claim 1, wherein the light wavelengths of each first light-emitting chips and each second light-emitting chip are between 400 nm and 500 nm.

5. The quasi-optical LED package structure according to claim 1, wherein the first color temperature generated by the at least one first light-emitting module is smaller than the second color temperature generated by the at least one second light-emitting module.

6. The quasi-optical LED package structure according to claim 1, wherein the at least two annular resin frames are phosphor resins.

7. The quasi-optical LED package structure according to claim 1, wherein the at least two annular resin frames are selectively separated from each other or connected with each other, and the at least two annular resin frames are disposed on the substrate body in series or in parallel.

8. The quasi-optical LED package structure according to claim 1, wherein each annular resin frame has an arc shape formed on a top surface thereof, each annular resin frame has a radius tangent and the angle of the radius tangent relative to the top surface of the substrate body is between 40° C. and 50° C., the maximum height of each annular resin frame relative to the top surface of the substrate body is between 0.3 mm and 0.7 mm, the width of a bottom side of each annular resin frame is between 1.5 mm and 3 mm, the thixotropic index of each annular resin frame is between 4 and 6, and each annular resin frame is a white thermohardening resin frame mixed with inorganic additive.

9. A quasi-optical LED package structure for increasing color render index and brightness, comprising:
 a substrate unit having at least one substrate body and at least two chip-placing areas formed on the at least one substrate body;
 a light-emitting unit having at least one first light-emitting module for generating a first color temperature and at least one second light-emitting module for generating a second color temperature, wherein the at least one first light-emitting module has a plurality of first light-emitting chips electrically disposed on one of the chip-placing areas of the substrate unit, and the at least one second light-emitting module has a plurality of second light-emitting chips electrically disposed on the other chip-placing area of the substrate unit;

a frame unit having at least one first annular resin frame and at least one second annular resin frame surroundingly formed on a top surface of the substrate body by coating, wherein the at least one first annular resin frame surrounds the at least one first light-emitting module in order to form at least one first resin position limiting space above the substrate body, and the at least one second annular resin frame surrounds the at least one second light-emitting module and the at least one first annular resin frame in order to form at least one second resin position limiting space above the substrate body and between the at least one first annular resin frame and the at least one second annular resin frame; and a package unit having at least one first translucent package resin body and at least one second translucent package resin body both disposed on the substrate body and respectively covering the at least one first light-emitting module and the at least one second light-emitting module, wherein the at least one first translucent package resin body is limited in the at least one first resin position limiting space, and the at least one second translucent package resin body is limited in the at least one second resin position limiting space.

10. The quasi-optical LED package structure according to claim 9, wherein the substrate body has a circuit substrate, a heat-dissipating layer disposed on a bottom surface of the circuit substrate, a plurality conductive pads disposed on a top surface of the circuit substrate, and an insulative layer disposed on the top surface of the circuit substrate in order to expose the conductive pads.

11. The quasi-optical LED package structure according to claim 9, wherein each first light-emitting chip is a blue light-emitting chip, the at least one first translucent package resin body is a phosphors with a first color, and light beams generated by the blue light-emitting chips pass through the at least one first translucent package resin body for generating yellow beams about 3500 K color temperature, wherein each second light-emitting chip is a blue light-emitting chip, the at least one second translucent package resin body is a phosphors with a second color, and light beams generated by the blue light-emitting chips pass through the at least one second translucent package resin body for generating white beams about 6500 K color temperature.

12. The quasi-optical LED package structure according to claim 9, wherein the light wavelengths of each first light-emitting chips and each second light-emitting chip are between 400 nm and 500 nm.

13. The quasi-optical LED package structure according to claim 9, wherein the first color temperature generated by the at least one first light-emitting module is smaller or larger than the second color temperature generated by the at least one second light-emitting module.

14. The quasi-optical LED package structure according to claim 9, wherein the at least one first annular resin frame and the at least one second annular resin frame are arranged as concentric circles, and the at least one second light-emitting module is disposed between the at least one first annular resin frame and the at least one second annular resin frame.

15. The quasi-optical LED package structure according to claim 9, wherein the at least one first annular resin frame is a phosphor resin, and the at least one second annular resin frame is a phosphor resin or light reflecting resin.

16. The quasi-optical LED package structure according to claim 9, wherein the at least one first annular resin frame has an arc shape formed on a top surface thereof, the at least one first annular resin frame has a radius tangent and the angle of the radius tangent relative to the top surface of the substrate body is between 40° C. and 50° C., the maximum height of the at least one first annular resin frame relative to the top surface of the substrate body is between 0.3 mm and 0.7 mm, the width of a bottom side of the at least one first annular resin frame is between 1.5 mm and 3 mm, the thixotropic index of the at least one first annular resin frame is between 4 and 6, and the at least one first annular resin frame is a white thermohardening resin frame mixed with inorganic additive.

17. The quasi-optical LED package structure according to claim 9, wherein the at least one second annular resin frame has an arc shape formed on a top surface thereof, the at least one second annular resin frame has a radius tangent and the angle of the radius tangent relative to the top surface of the substrate body is between 40° C. and 50° C., the maximum height of the at least one second annular resin frame relative to the top surface of the substrate body is between 0.3 mm and 0.7 mm, the width of a bottom side of the at least one second annular resin frame is between 1.5 mm and 3 mm, the thixotropic index of the at least one second annular resin frame is between 4 and 6, and the at least one second annular resin frame is a white thermohardening resin frame mixed with inorganic additive.

18. A quasi-optical LED package structure for increasing color render index and brightness, comprising:

a substrate unit;

a light-emitting unit having at least one first light-emitting module for generating a first color temperature and at least one second light-emitting module for generating a second color temperature, wherein the at least one first light-emitting module has a plurality of first light-emitting chips electrically disposed on the substrate unit, and the at least one second light-emitting module has a plurality of second light-emitting chips electrically disposed on the substrate unit;

a frame unit having at least one first annular resin frame and at least one second annular resin frame surroundingly formed on a top surface of the substrate unit, wherein the at least one first annular resin frame surrounds the at least one first light-emitting module in order to form at least one first resin position limiting space above the substrate body, and the at least one second annular resin frame surrounds the at least one second light-emitting module and the at least one first annular resin frame in order to form at least one second resin position limiting space above the substrate body and between the at least one first annular resin frame and the at least one second annular resin frame; and a package unit having at least one first translucent package resin body and at least one second translucent package resin body both disposed on the substrate body and respectively covering the at least one first light-emitting module and the at least one second light-emitting module, wherein the at least one first translucent package resin body is limited in the at least one first resin position limiting space, and the at least one second translucent package resin body is limited in the at least one second resin position limiting space.

19. The quasi-optical LED package structure according to claim 18, wherein the at least one first annular resin frame and the at least one second annular resin frame are arranged as concentric circles, and the at least one second light-emitting module is disposed between the at least one first annular resin frame and the at least one second annular resin frame.

20. The quasi-optical LED package structure according to claim 18, wherein the at least one first annular resin frame is a phosphor resin, and the at least one second annular resin frame is a phosphor resin or light reflecting resin.

* * * * *